US011810765B2

(12) United States Patent
Gutman et al.

(10) Patent No.: US 11,810,765 B2
(45) Date of Patent: Nov. 7, 2023

(54) REACTIVE PARTICLES SUPPLY SYSTEM

(71) Applicant: Applied Materials Israel Ltd., Rehovot (IL)

(72) Inventors: Asaf Gutman, Gan Hashomron (IL); Irit Ruach-Nir, Rehovot (IL); Kfir Luria, Petach Tiqva (IL); Sven Ruhle, Tel Aviv (IL); Guy Eytan, Kidron (IL)

(73) Assignee: Applied Materials Israel Ltd., Rehovot (IL)

( * ) Notice: Subject to any disclaimer, the term of this patent is extended or adjusted under 35 U.S.C. 154(b) by 477 days.

(21) Appl. No.: 17/129,747

(22) Filed: Dec. 21, 2020

(65) Prior Publication Data

US 2022/0199370 A1 Jun. 23, 2022

(51) Int. Cl.
| | | |
|---|---|---|
| *H01J 37/32* | (2006.01) | |
| *F16K 3/04* | (2006.01) | |
| *C23C 16/44* | (2006.01) | |
| *F16K 3/32* | (2006.01) | |
| *F16K 3/34* | (2006.01) | |
| *C23C 14/00* | (2006.01) | |
| *F16K 3/08* | (2006.01) | |

(52) U.S. Cl.
CPC .... *H01J 37/32449* (2013.01); *C23C 14/0042* (2013.01); *C23C 14/0063* (2013.01); *C23C 16/4405* (2013.01); *F16K 3/04* (2013.01); *F16K 3/085* (2013.01); *F16K 3/32* (2013.01); *F16K 3/34* (2013.01); *H01J 37/3244* (2013.01); *H01J 37/32513* (2013.01); *H01J 37/32623* (2013.01); *H01J 37/32862* (2013.01)

(58) Field of Classification Search
CPC ... F16K 3/085; F16K 3/32; F16K 3/08; F16K 3/34; F16K 3/04; H01J 37/32449; H01J 37/3244; C23C 14/0042; C23C 14/0063; C23C 16/4405
See application file for complete search history.

(56) References Cited

U.S. PATENT DOCUMENTS

| | | | | |
|---|---|---|---|---|
| 1,982,754 | A * | 12/1934 | Peterson | F16K 3/34 137/557 |
| 4,683,118 | A * | 7/1987 | Hayashi | B22F 1/148 419/48 |
| 2008/0067456 | A1* | 3/2008 | Kloepfel | H05G 2/003 250/504 R |

* cited by examiner

*Primary Examiner* — Atif H Chaudry
(74) *Attorney, Agent, or Firm* — KILPATRICK TOWNSEND & STOCKTON LLP

(57) ABSTRACT

A reactive particles supply system that may include an adjustable gas supply unit that is arranged to supply gas and to set a gas condition, a reactive particles supply unit that may be arranged to receive the gas, and an adjustable reactive particles output unit that may include a reactive particles input, a second reactive particles output, and a reactive particles path. The second reactive particles output is configured to output reactive particles towards an opening of a vacuumed chamber. The adjustable reactive particles output unit is arranged to mechanically configure at least one element of the reactive particles path according to the reactive particles condition.

20 Claims, 13 Drawing Sheets

REACTIVE PARTICLES SUPPLY SYSTEM

TECHNICAL FIELD

Various embodiments illustrated below related to supply of reactive particles to a vacuumed chamber.

BACKGROUND

Vacuumed chambers are used in various object evaluation systems and, additionally or alternatively, in various object manufacturing systems. An example of an object evaluation system may include a scanning electron microscope, a charged particle imager, and the like.

The vacuumed chamber and any object within the vacuumed chamber aggregated contaminates.

The vacuumed chamber can be cleaned by using a reactive particles supply system that directs a stream of reactive particles into the vacuumed chamber.

The stream of reactive particles significantly increases the vacuum pressure within the vacuumed chamber. Due to the significant increment of vacuum pressure—the vacuumed chamber has to be deactivated before the cleaning occurs The deactivation and re-activation is time consuming and reduces the throughput of the vacuumed chamber.

There is a growing need to provide an effective method for cleaning a vacuumed chamber.

SUMMARY

There may be provided a reactive particles supply system for supplying reactive particles to a vacuumed chamber.

BRIEF DESCRIPTION OF THE DRAWINGS

The subject matter regarded as the embodiments of the disclosure is particularly pointed out and distinctly claimed in the concluding portion of the specification. The embodiments of the disclosure, however, both as to organization and method of operation, together with objects, features, and advantages thereof, may best be understood by reference to the following detailed description when read with the accompanying drawings in which:

DETAILED DESCRIPTION

Figure 1:
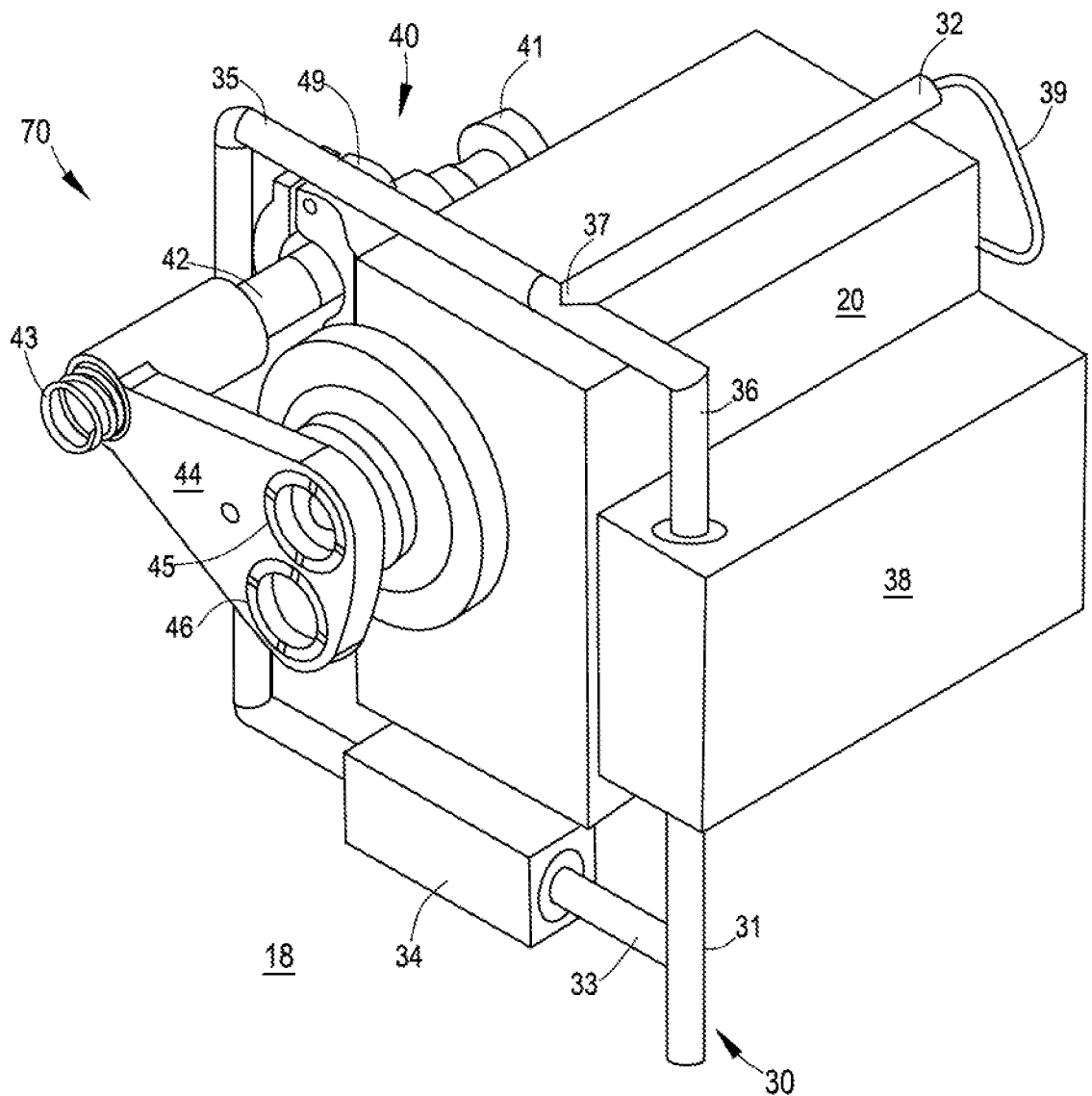
FIG. 1 illustrates an example of at least some parts of a reactive particles supply system.

In the following detailed description, numerous specific details are set forth in order to provide a thorough understanding of the embodiments of the disclosure.

However, it will be understood by those skilled in the art that the present embodiments of the disclosure may be practiced without these specific details. In other instances, well-known methods, procedures, and components have not been described in detail so as not to obscure the present embodiments of the disclosure.

The subject matter regarded as the embodiments of the disclosure is particularly pointed out and distinctly claimed in the concluding portion of the specification. The embodiments of the disclosure, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the disclosure may for the most part, be implemented using electronic components and circuits known to those skilled in the art, details will not be explained in any greater extent than that considered necessary as illustrated above, for the understanding and appreciation of the underlying concepts of the present embodiments of the disclosure and in order not to obfuscate or distract from the teachings of the present embodiments of the disclosure Any reference in the specification to a method should be applied mutatis mutandis to a system capable of executing the method.

Any reference in the specification to a system should be applied mutatis mutandis to a method that may be executed by the system.

The term "output condition" in relation to reactive particles refers to the condition of reactive particles when outputted from a reactive particles supply system. The term "intermediate condition" in relation to reactive particles related to the condition of reactive particles being outputted by a reactive particles supply unit of the reactive particles supply system.

The condition may be at least one of pressure, flow rate, and reactive particles concentration. The reactive particles may be plasma, may be reactive gas (such as but not limited to Ozone), may be radicals. The reactive particles supply system may convert reactive particles of one type (for example plasma or reactive gas) to another type (for example radicals). The reactive particles supply system may maintain the type of the reactive particles. For example—an aperture of a certain size may receive plasma and output plasma—while another aperture (for example a smaller aperture) may receive plasma and output radicals.

An aperture may be selected based on the geometrical parameters of the aperture. The geometrical parameter of the selected aperture are expected to provide appropriate flow conductance which, in combination with pumping of the vacuumed chamber, keeps the vacuum pressure within the vacuumed chamber at an appropriate vacuum range around a predetermined vacuum pressure, which is sufficient for its operation (i.e. working pressure), while the reactive gas generating unit can operate at a different operating pressure. For example, ignition of plasma (when plasma is generated by the reactive particles supply unit) is possible only at certain reactive gas pressure range (usually higher than the vacuum pressure within the vacuumed chamber)—therefore, there is a need to control the conductance between the reactive particles supply unit and the vacuumed chamber. The predetermined vacuum pressure may define the geometrical parameters (such as aperture size) and may also define the cleaning rate of the vacuumed chamber.

The reactive particles may be used for cleaning or for any other purpose (for example etching). For simplicity of explanation the specification will refer to cleaning.

It has been found that a vacuumed chamber may be cleaned using different values of a reactive particles condition. The vacuumed chamber may operate at low vacuum pressure and the provision to the reactive particles into the vacuumed chamber may increase the vacuum pressure within the vacuumed chamber.

Lower values of an output reactive particles condition provides slower cleaning rates but less interference with the require vacuum pressure within the vacuumed chamber. Higher values of the output reactive particles condition provide faster cleaning rates but may result in more significant disturbances to the vacuumed chamber.

The reactive particles supply system may be configured to output reactive particles at an output reactive particles condition of a value that is selected out of multiple values of the reactive particles condition.

The multiple values of the output reactive particles condition may be used during different cleaning modes of the vacuumed chamber. Thus—each cleaning mode may be associated with one or more values of reactive particles condition.

The different cleaning modes may include any number of cleaning modes. For simplicity of explanation it is assumed that there are two cleaning modes:

A first cleaning mode during which the reactive particles supply system may be configured to output reactive particles at an output reactive particles condition of a first value.

A second cleaning mode during which the reactive particles supply system may be configured to output reactive particles at an output reactive particles condition of a second value. The second value exceeds the first value.

The reactive particles supply system, when operating in the first cleaning mode, may be configured clean the vacuumed chamber while the vacuumed chamber may be active and operated at a certain vacuum pressure. The certain vacuum pressure may be defined by the operation performed in the vacuumed chamber—for example inspection, fabrication of an object, and the like. The certain vacuum pressure may range, for example, between $10^{-3}$ Torr and $10^{-13}$ Torr.

The reactive particles supply system, when operating in the second cleaning mode, may be configured clean the vacuumed chamber while the vacuumed chamber may be either deactivated or operated at another vacuum pressure that may be higher pressure than the certain vacuum pressure.

The suggested reactive particles supply system may change the output reactive particles condition without disassembling the reactive particles supply system and without deactivating the vacuumed chamber.

The suggested reactive particles supply system may change the output reactive particles condition without contaminating the vacuumed chamber.

The reactive particles supply system may include an adjustable gas supply unit, a reactive particles supply unit, and an adjustable reactive particles output unit.

The adjustable gas supply unit may be arranged to supply gas and to set a value of the gas condition out of multiple values of gas condition.

The multiple gas condition values may be discrete and spaced-apart values, may span along one or more continuous value ranges, and the like. There may be any number of different values of gas condition.

The reactive particles supply unit may be configured to a convert gas to a stream of reactive particles (hereinafter "reactive particles") having an intermediate output reactive particles condition of a certain value. The value of the intermediate reactive particles condition corresponds to a value of the gas condition—for example—both values may be substantially equal to each other. The stream of reactive particles may be used to clean a vacuumed chamber from contaminants.

The reactive particles supply unit may include a gas input and a first reactive particles output. The gas input is fluidly coupled to the adjustable gas supply unit and is arranged to receive the gas. The reactive particles output is arranged to output the stream of reactive particles.

The adjustable reactive particles output unit may provide a reactive particles path in which the reactive particles may propagate until entering the vacuumed chamber.

Different values of the reactive particles condition may require different mechanical configurations of the reactive particles path. The adjustable reactive particles output unit may be arranged to configure the reactive particles path according to the value of the reactive particles condition.

The different mechanical configuration may involve setting a size of reactive particles condition regulating element such as an aperture, through which the reactive particles propagates. Smaller apertures correspond to lower values of reactive particles flow rate and may be used to control the reactive particles pressure.

The adjustable reactive particles output unit may include a reactive particles input, a second reactive particles output and a reactive particles path.

The second reactive particles output is arranged to output reactive particles towards an opening at the entrance of the vacuumed chamber.

The reactive particles path fluidly couples the reactive particles input to the second reactive particles output.

The adjustable reactive particles output unit is arranged to mechanically configure at least one element of the reactive particles path according to the current reactive particles pressure level.

The adjustable reactive particles output unit may be arranged to configure the at least one element of the reactive particles path by a selection a current aperture associated with the reactive particles condition, wherein the current aperture may be selected out of different apertures associated with different values of the reactive particles condition.

A selection of a value of a reactive particles condition may include selecting a current aperture by replacing a previous aperture that was positioned within the reactive particles path by the current aperture by moving an aperture holder that holds the previous aperture and the current aperture.

The aperture holder may belong to a pivot arm. The aperture holder may be moved in any manner and may differ from a pivot arm.

The reactive particles supply system may include an aperture holder manipulator that may be configured to perform a rotational movement and a linear movement of the aperture holder. The aperture holder manipulator may be moved by a user, may be moved by a motor/fluid/spring etc., may be remotely controller, and the like.

The selection of the current aperture may include replacing a previous aperture that was positioned within the reactive particles path by the current aperture. The replacing may include moving the previous aperture away from the reactive particles path and positioning the current aperture within a sealed housing. The sealed housing is sealed in the sense that is allows particles to enter or exit only via its defined input and output.

The sealed housing may prevent or at least reduce contamination of the vacuumed chamber and may prevent or at least reduce reactive particles leakage. The sealed housing may force the reactive particles to flow through the aperture and not bypass it.

The reactive particles supply system may include a sealed housing. The sealed housing may include a first housing part and a second housing part.

The first housing part may be located downstream to the reactive particles input.

The second housing part may be located upstream to the vacuumed chamber.

To prevent contamination, protect the aperture sealing element and to insure proper sealing, the aperture holder manipulator may be configured to replace the previous aperture by the current aperture by:

Moving the aperture holder away from the first housing part.

Rotating the aperture holder to position the current aperture within the reactive particles path.

Moving the aperture holder towards the first housing part.

The rotation of the aperture holder after being moved away from the first holding path introduced a gap between the aperture holder and any aperture held by the aperture holder and the first housing part and prevents (or at least reduced) friction between the first housing part and the aperture holder and any aperture held by the aperture holder. The gap may assist in preserving any damage to sealing elements used to seal a connection between any of the apertures and the first housing part. For example—the movement may introduce a gap between an aperture and an aperture sealing element that is arranged to seal a connection between a first adaptor and the aperture.

Figure 2:
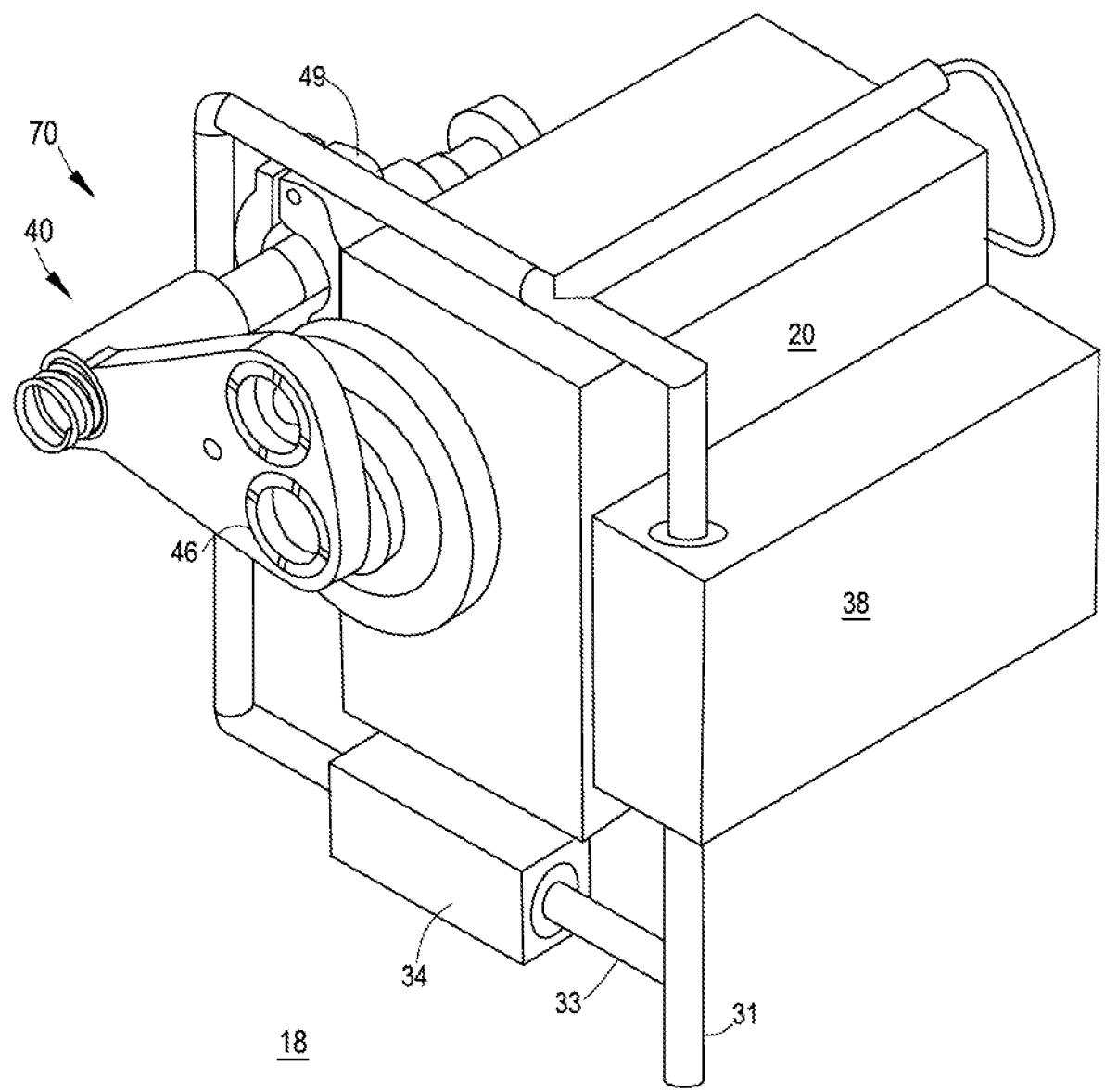
FIG. 2 illustrates an example of at least some parts of a reactive particles supply system.

FIGS. 1 and 2 illustrate the reactive particles supply system 18 as including reactive particles supply unit 20, adjustable gas supply unit 30, and some parts of the adjustable reactive particles output unit 70.

The adjustable gas supply unit 30 includes a first pipe 31 arranged to supply input gas to a bypass path (formed by second pipe 33, flow control unit 34, and third pipe 35), and to an adjustable pressure path (formed by adjustable gas pressure unit 38, and fourth pipe 36).

It should be noted that the same operation could be achieved without flow control unit 34 (bypass valve). For example, by using the adjustable gas flow unit 38 only, or using a combination of the adjustable gas flow unit 38 and a roughing valve (to prevent sudden pressure change inside the chamber). Yet for another example—the roughing valve can be integrated inside the adjustable gas flow unit 38. The adjustable gas flow unit 38 could be configured to perform flow control and also provide a bypass path (instead of the bypass valve 34).

The fourth pipe 36 and the fifth pipe are connected to each other and to fifth pipe 32 in junction 37. The fifth pipe is fluidly coupled to a gas input (not shown) of the reactive particles supply unit 20—for example via conduit 39.

The flow control unit 34 may include one or more valves for determining whether the gas will flow via the bypass path or not.

The adjustable gas supply unit 30 may have any other configuration.

FIGS. 1 and 2 illustrates the following parts of the adjustable reactive particles output unit: pivot arm 40, and a clamp 49 for connecting and sealing the manipulator unit to the sealed housing. The pivot arm 40 includes handle 41, axis 42, spring 43, aperture holder 44, first aperture 45 and second aperture 46.

In FIG. 1, the first aperture 45 is positioned within a reactive particles path.

In FIG. 2, the second aperture 46 is positioned within a reactive particles path.

Figure 3:
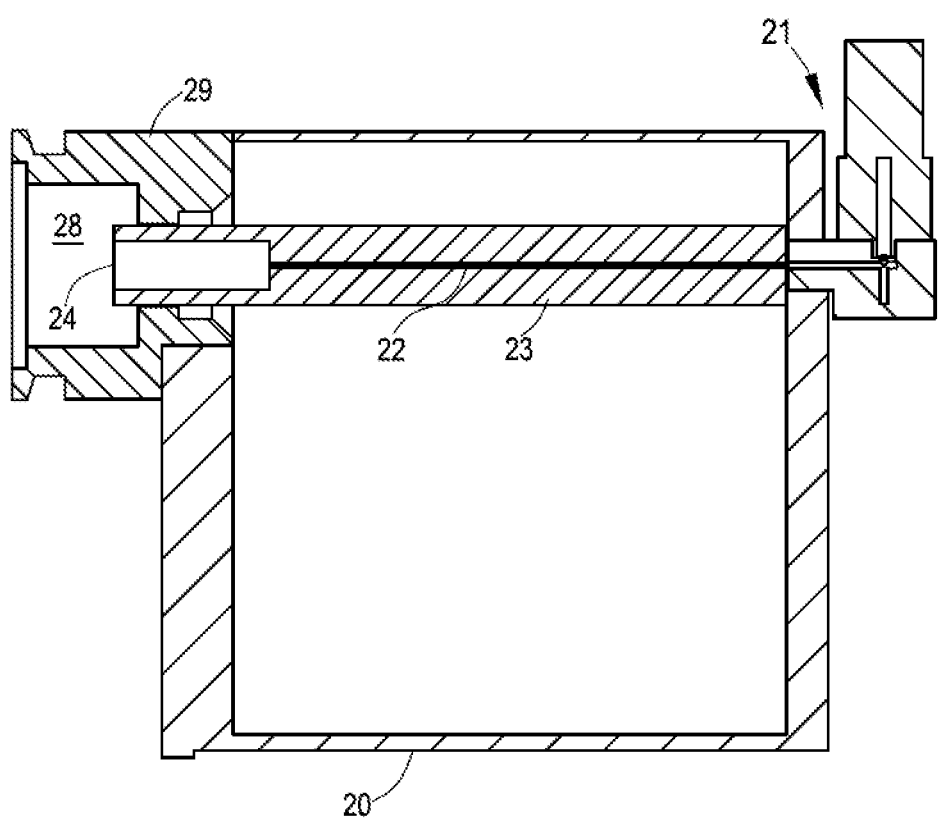
FIG. 3 illustrates an example of at least some parts of a reactive particles supply system.

FIG. 3 is a cross sectional view of the reactive particles supply unit 20. The reactive particles supply unit 20 includes a gas input 21, one or more components for converting the gas to reactive particles (not shown), and a first reactive particles output 23 (having an interior space 22).

The reactive particles supply unit may include a reactive particles supply unit output interface 29 that has a first inner space 28.

The first reactive particles output 24 may extend within the first inner space.

Figure 4:
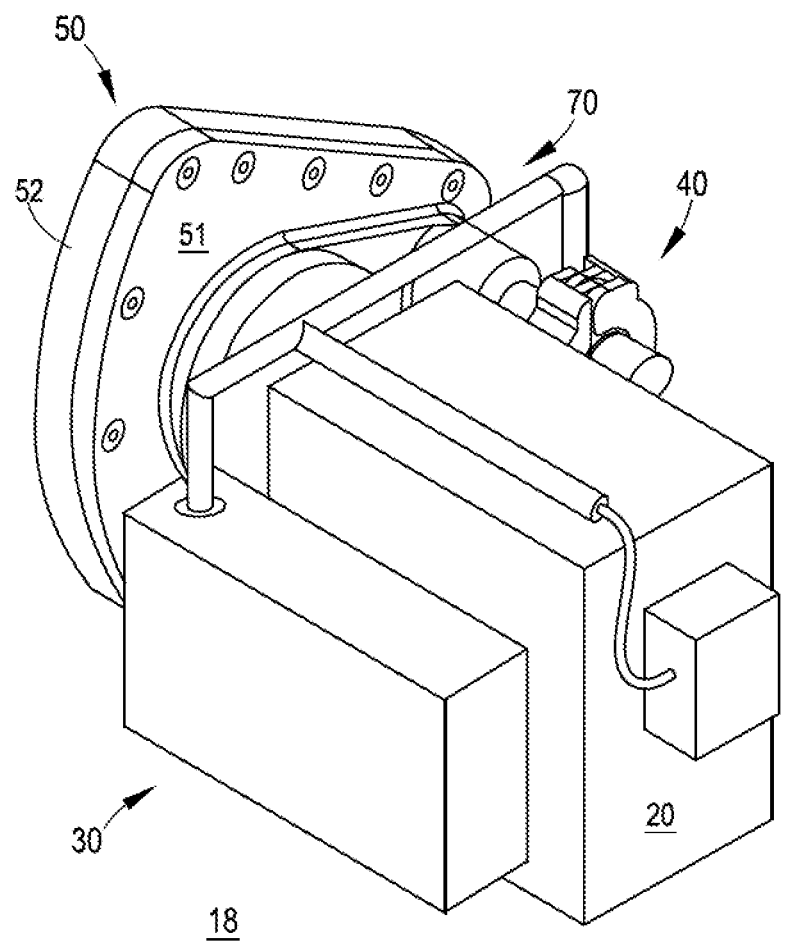
FIG. 4 illustrates an example of at least some parts of a reactive particles supply system.
Figure 5:
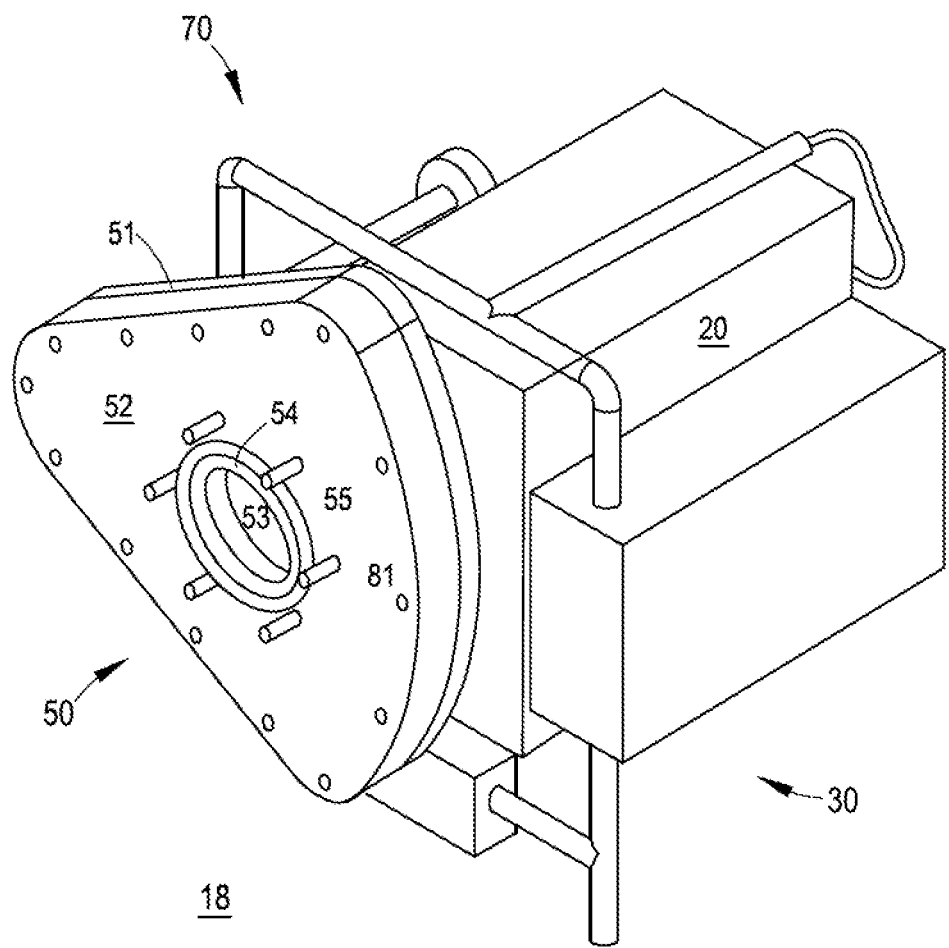
FIG. 5 illustrates an example of at least some parts of a reactive particles supply system.

FIGS. 4 and 5 illustrates the reactive particles supply system 18 as including reactive particles supply unit 20, adjustable gas supply unit 30, and some parts of the adjustable reactive particles output unit 70.

The parts of the adjustable reactive particles output unit 70 illustrated in FIGS. 4 and 5 include the sealed housing 50, the sealed housing includes a first housing part 51 and a second housing part 52. The first housing part 51 and the second housing part 52 are sealingly connected to each other. FIGS. 4 and 5 illustrate various blots used to connect the first housing part 51 to the second housing part 52 (other means of connection may be used).

FIG. 5 also illustrates connecting elements such as bolts 55 for connecting the housing to a vacuumed chamber, a second reactive particles port 53 formed in the second housing part 52, and a ring 54 that extends from the surface of the second housing part 52.

Figure 6:
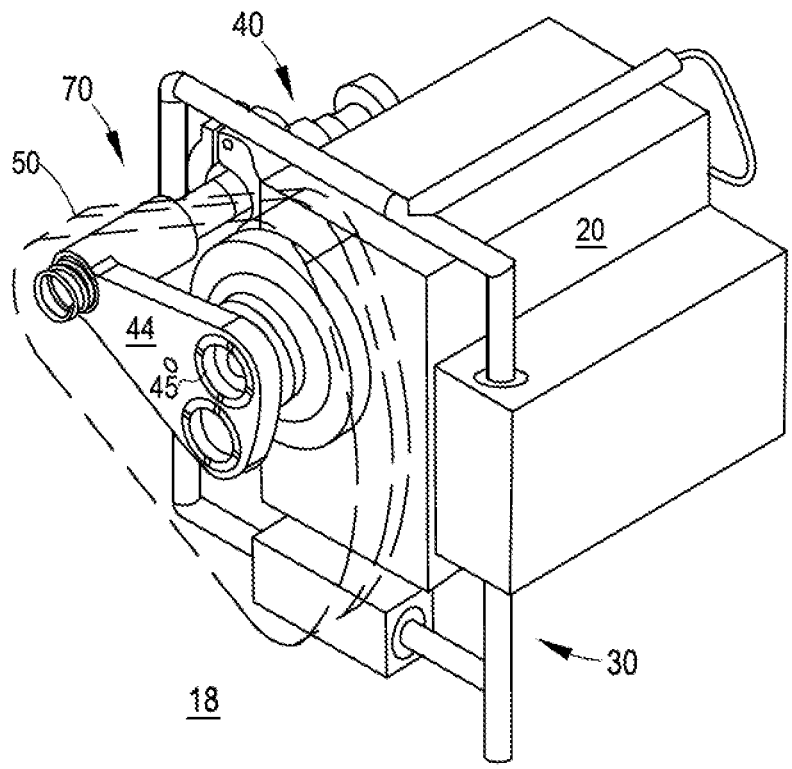
FIG. 6 illustrates an example of at least some parts of a reactive particles supply system.
Figure 6:
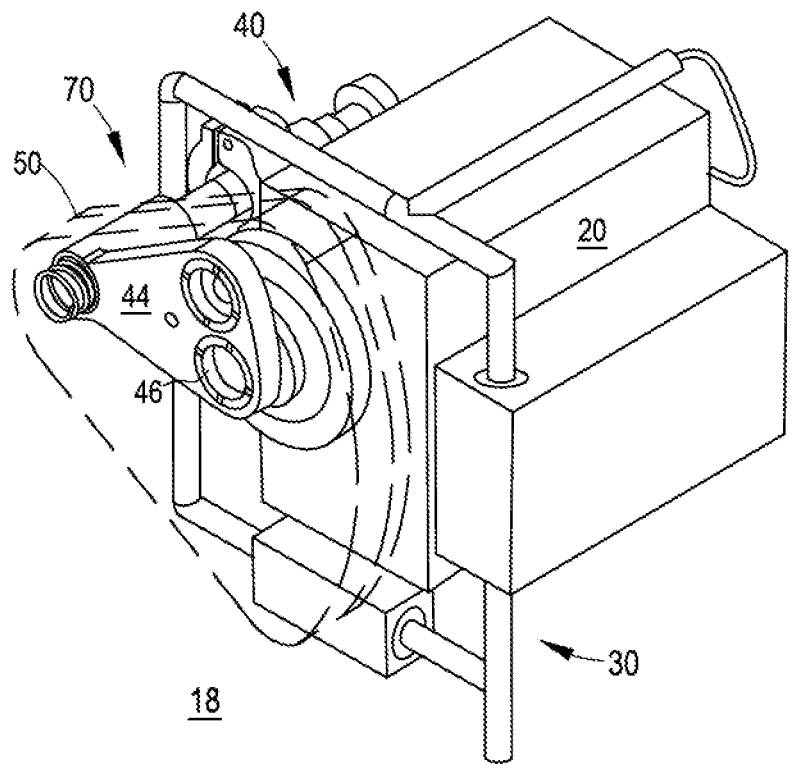

FIG. 6 illustrates the reactive particles supply system 18 as including reactive particles supply unit 20, adjustable gas supply unit 30, and some parts of the adjustable reactive particles output unit 70. The parts include a pivot arm 40 that includes aperture holder 44. The dashed lines represent the housing 50 in which the aperture holder 44 moves.

At the upper part of FIG. 6 the first aperture 45 is within the reactive particles path.

At the lower part of FIG. 6 the second aperture 46 is within the reactive particles path.

Figure 7:
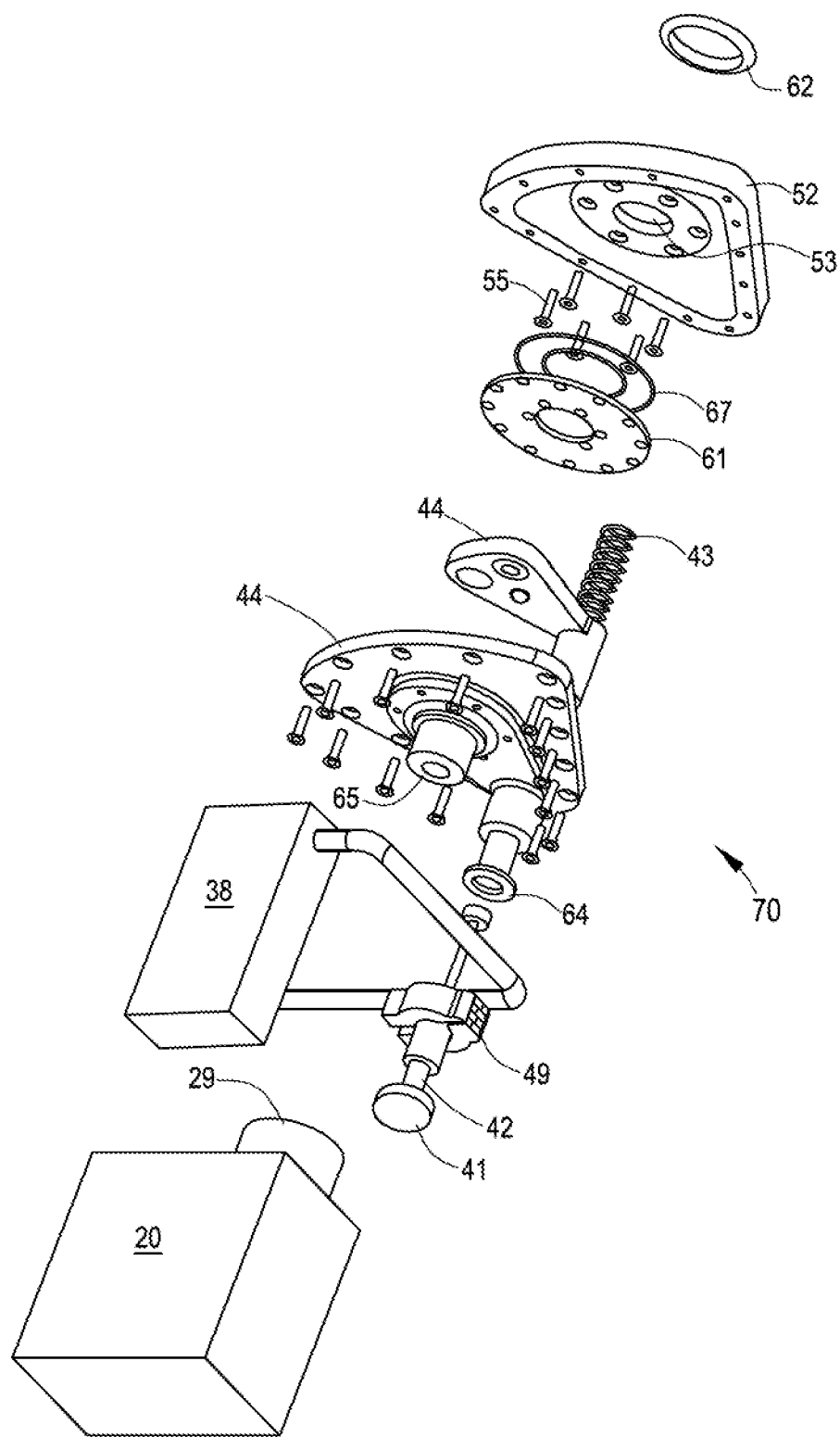
FIG. 7 illustrates an example of at least some parts of a reactive particles supply system.
Figure 8:
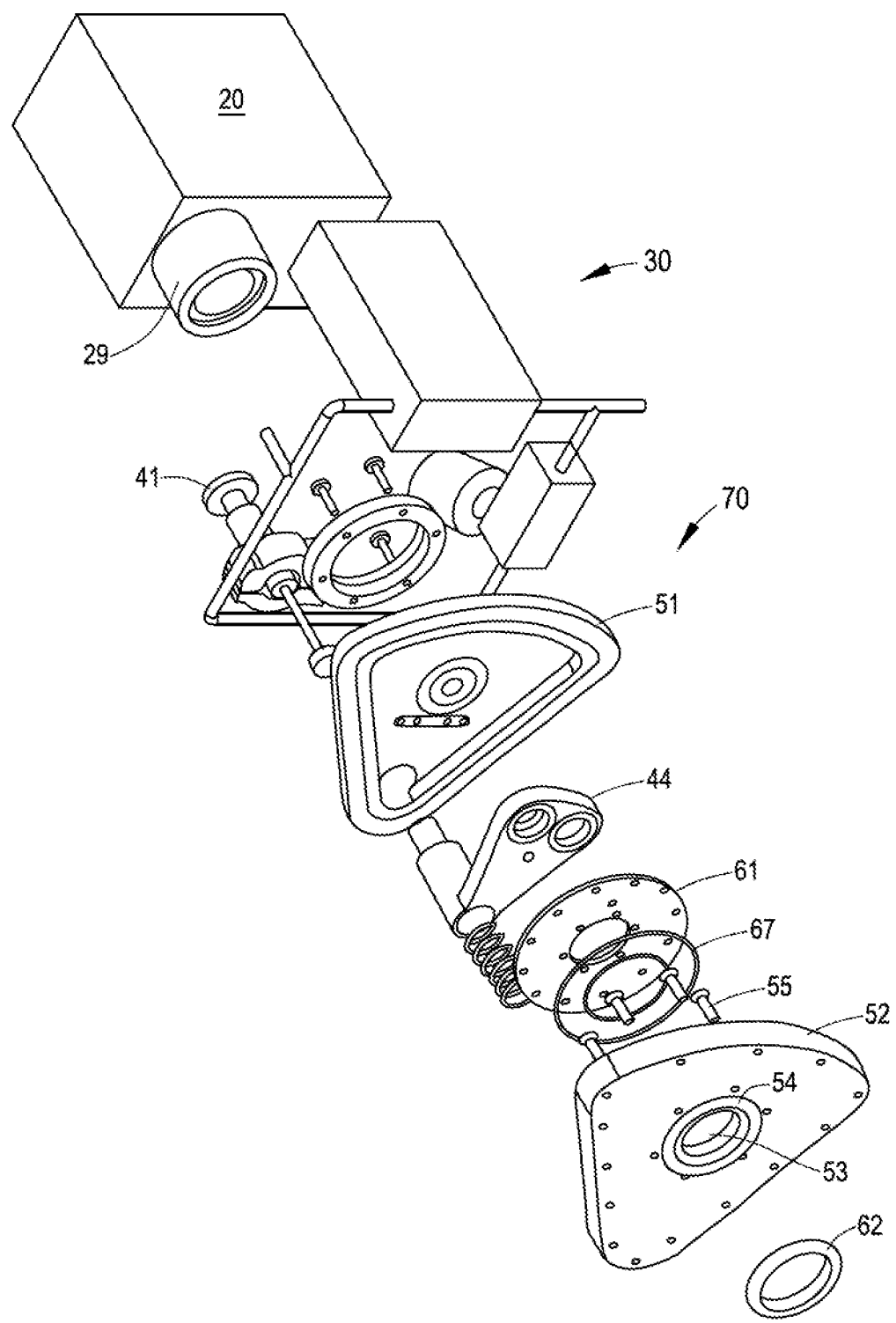
FIG. 8 illustrates an example of at least some parts of a reactive particles supply system.

FIGS. 7 and 8 illustrate the reactive particles supply system 18 as including reactive particles supply unit 20 (illustrated as including reactive particles supply unit output interface 29), adjustable gas supply unit 30, and some parts of the adjustable reactive particles output unit 70.

The parts of the adjustable reactive particles output unit 70 include (going downstream)—handle 41, axis 42, pivot arm axis support element 64 (that may be an integral part of the first part of the housing or may be a separate part), first adaptor 65 (that may be an integral part of the first part of the housing or may be a separate part), first housing part 51, aperture holder 44, sealing plate 61, sealing plate 61, additional sealing elements 67, first connectors (such as bolts 55), sealing plate recess 63 (formed in second housing part 52) for receiving the sealing plate 61, and intermediate seal 62.

Figure 9:
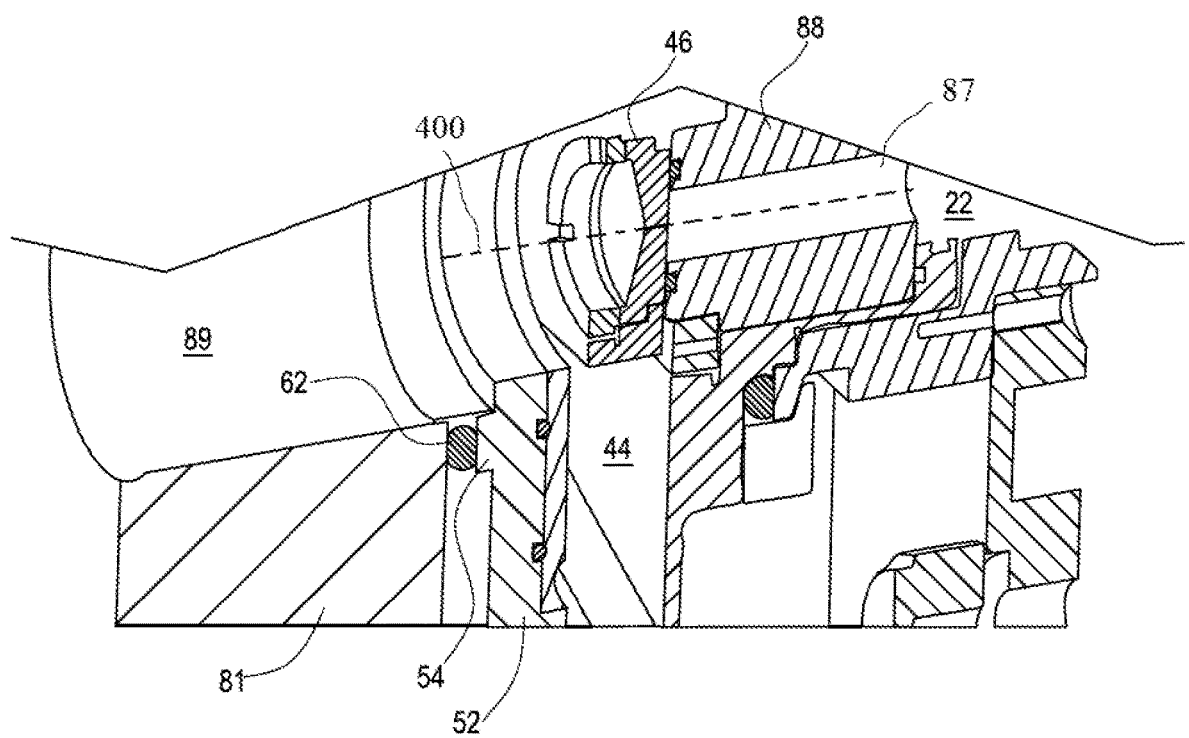
FIG. 9 illustrates an example of at least some parts of a reactive particles supply system.
Figure 10:
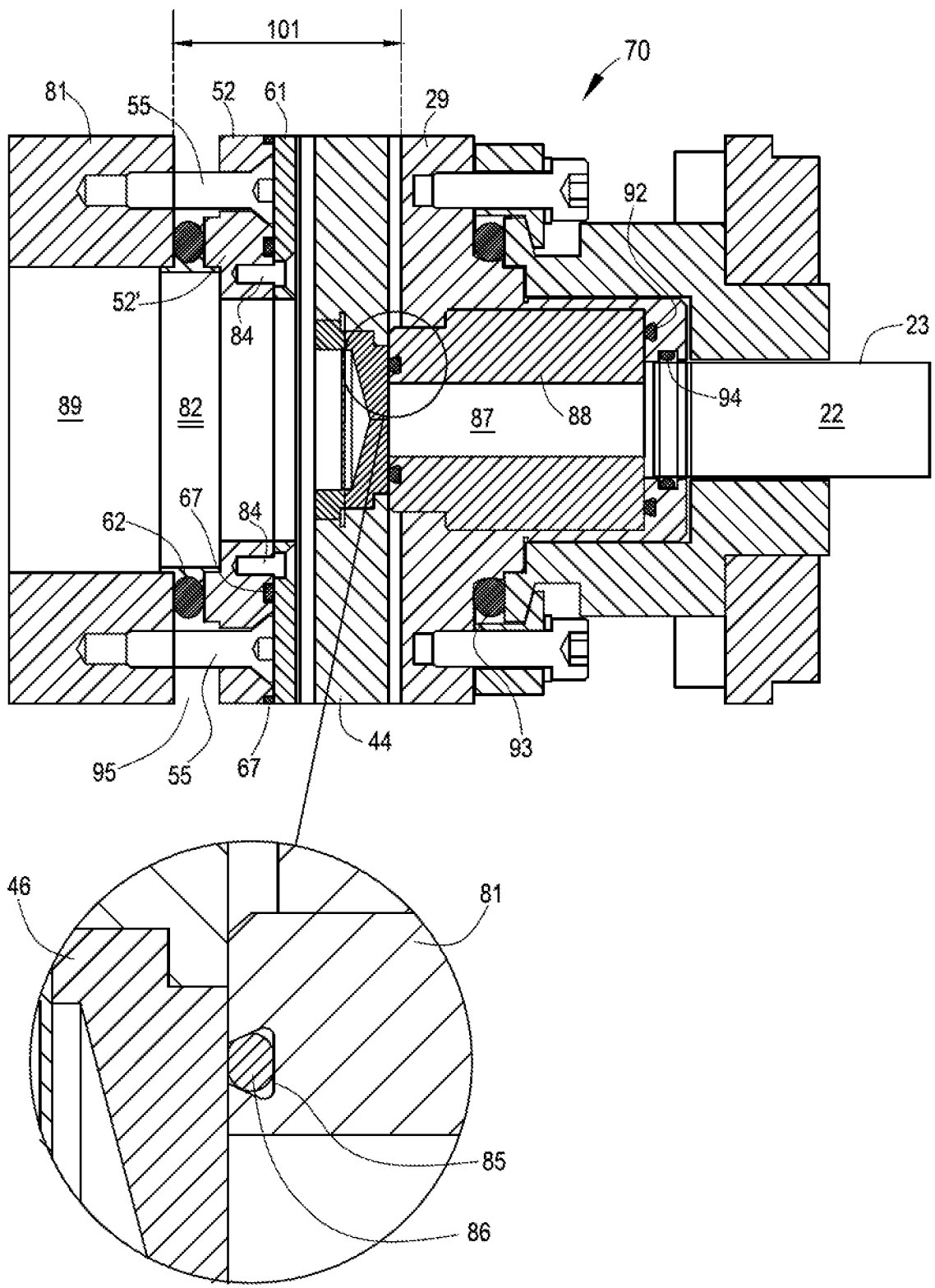
FIG. 10 illustrates an example of at least some parts of a reactive particles supply system and a vacuumed chamber.

FIG. 10 illustrates a wall 81 of a vacuumed chamber, a path 89 formed in the wall, some parts of the reactive particles supply unit 20 and some parts of the adjustable reactive particles output unit 70. FIG. 9 illustrates some of the parts shown in FIG. 10. FIG. 9 also illustrates reactive particles path 400.

The parts of the reactive particles supply unit 20 include first reactive particles output 23 (having an interior space 22) that is sealingly connected (using reactive particles output sealing element 94) to the reactive particles supply unit output interface 29.

The first reactive particles output 23 may be of different lengths and thus may end at different locations within the first inner space (denoted 28 in FIG. 4). Thus—the first inner space may be arranged to receive first reactive particles output of different lengths.

The reactive particles output sealing element 94 may surround the first reactive particles output and may sealingly coupled the first reactive particles output to the first inner space.

The first adaptor 88 may have an inner conduit 87 and may be shaped and sized to position the inner conduit 87 within the reactive particles path when the first adaptor 88 is positioned, at least partially, within the first inner space (denoted 28 in FIG. 2). The inner conduit 87 (and even the first adaptor 88) can be regarded as the first reactive particles input of the adjustable reactive particles output unit.

One or more reactive particles sealing elements (such as sealing elements 92) are configured to prevent a leakage of reactive particles between the reactive particles supply unit output interface and the first adaptor.

The first adaptor may include a mechanical interface (such as recess 85) for holding aperture sealing element 86. It should be noted that the holding aperture sealing element and the recess may be formed in the aperture or in the aperture holder. The aperture sealing element 86 may be configured to seal a connection between the first adaptor 88 and an aperture (such as second aperture 46) located in the reactive particles path.

The mechanical interface may be configured to hold the aperture sealing element 86 regardless of a distance between the aperture sealing element and the current aperture.

In FIG. 10 the mechanical interface is a recess having a dovetail shaped cross section.

FIG. 10 also illustrates first connector such as a bolt 55, a second connector such as bolt 84 and an intermediate element 82. wherein the sealed housing may include a sealing plate recess (denoted 53 in FIG. 7), a first connector opening 52', and a second connector opening 84'.

The first connector may be arranged to pass through the first connector opening 55' and to connect the sealed housing 50 to the vacuumed chamber.

The sealing plate 61 and the additional sealing element 67 may be configured to seal a connection between the first connector and the first connector opening. The second connector may be configured to connect the sealing plate 61 to the second housing part 52.

The intermediate element 82 may be shaped as a ring. The intermediate element 82 may include an external recess for receiving an intermediate seal 62.

The intermediate seal 62 may be pressed between the wall of the vacuumed chamber and ring 54.

The reactive particles supply system may replace a reactive particles supply unit that is configured to output reactive particles only at a single reactive particles condition.

The reactive particles supply unit may be located in relatively small spaced and it may be beneficial to have a relatively narrow adjustable reactive particles output unit 70—as the narrow adjustable reactive particles output unit 70 is positioned between the vacuumed chamber and the reactive particles supply unit.

The reactive particles supply unit may be integrated within the reactive particles supply system without any modifications. For example—the reactive particles supply unit may be off the shelf unit.

The width of the adjustable reactive particles output unit 70 may not exceed a few centimeters (for example may not exceed 5 centimeters).

Figure 11:
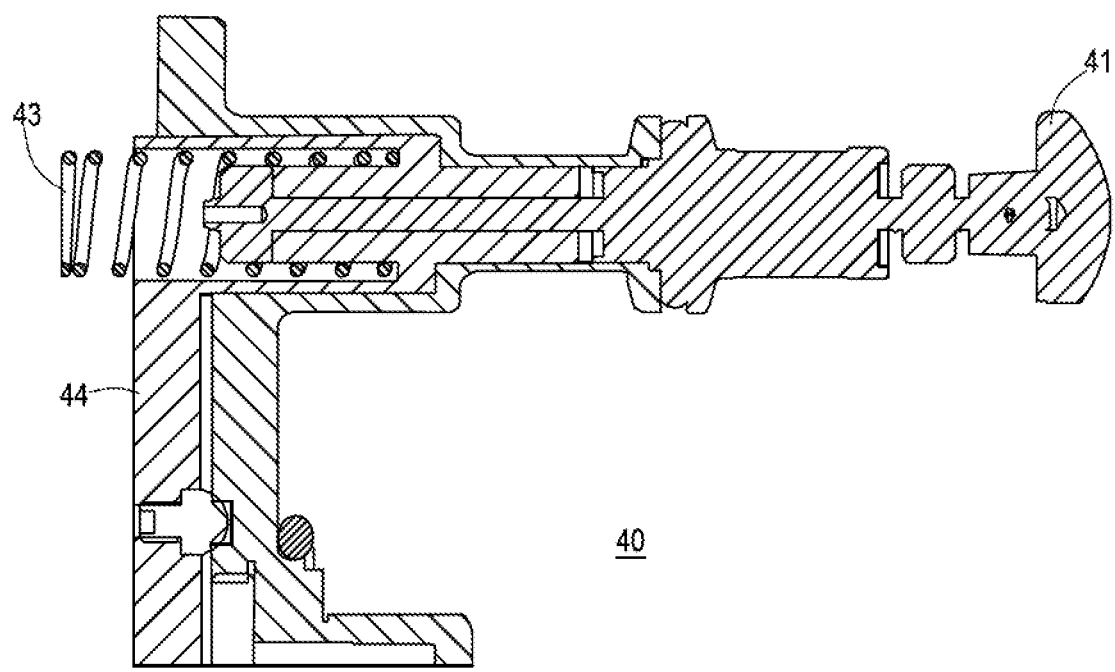
FIG. 11 illustrates an example of at least some parts of a reactive particles supply system and a vacuumed chamber.

FIG. 11 illustrates a cross section of some parts of the pivot arm 40—such as handle 41, spring 43 and a part of the aperture holder 44. Other parts were not shown for simplicity of explanation.

Figure 12:
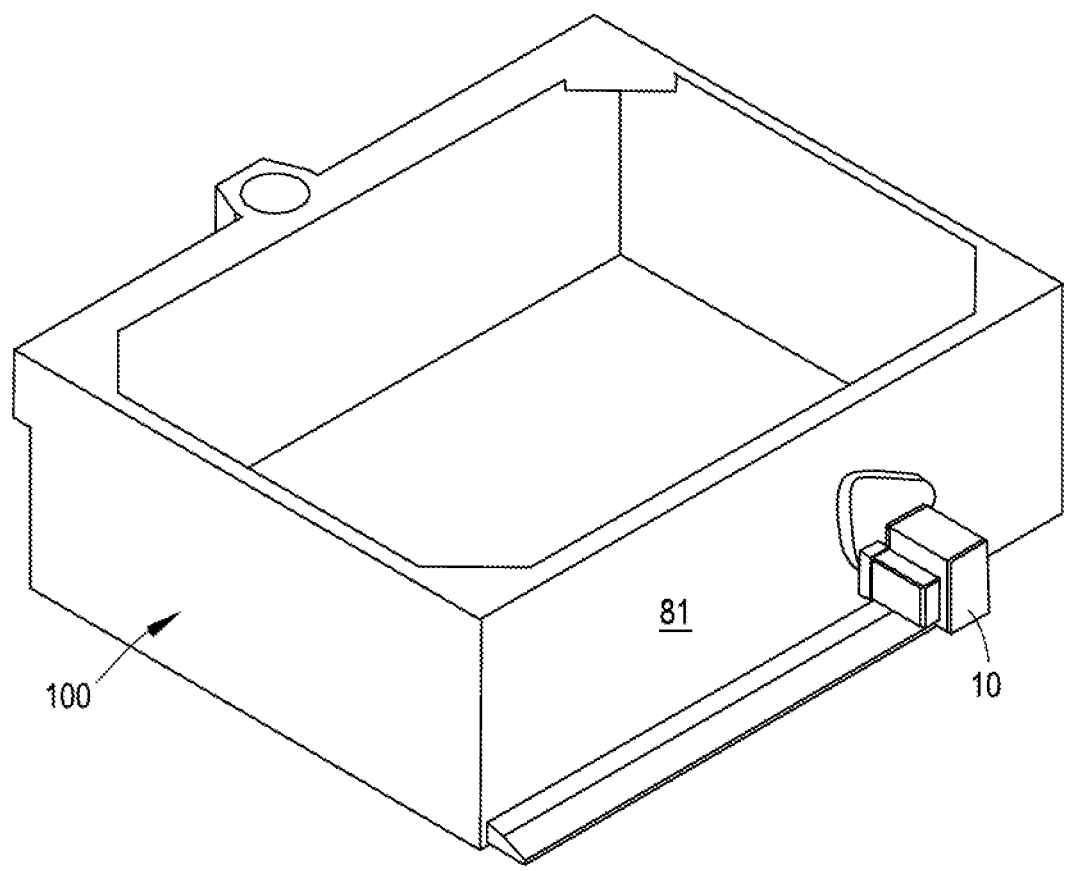
FIG. 12 illustrates an example of at least some parts of a reactive particles supply system and a vacuumed chamber.

FIG. 12 illustrates an example of the reactive particles supply system 18 and a vacuumed chamber 100 connected to a wall 81 of the vacuumed chamber.

There may be provided a method for operating the reactive particles supply system of any of the previous figures.

There may be provided a method for operating a reactive particles supply system, the method may include (a) configuring the reactive particles supply system to provide reactive particles at a selected value of an output reactive particles condition; wherein the output reactive particles condition may include at least one out of reactive particles pressure, reactive particles flow rate and reactive particles concentration; and (b) generating and outputting reactive particles of the selected value of the output reactive particles condition by the reactive particles supply system.

The configuring of the reactive particles supply system may include setting an adjustable gas supply unit of the reactive particles supply system to supply gas of a gas condition to a value selected out of multiple values; wherein the gas condition may include at least one out of gas pressure, gas flow rate and gas reactive particles concentration; and mechanically configuring, by an adjustable reactive particles output unit of the reactive particles supply system, at least one element of a reactive particles path according to the output reactive particles condition of the selected value.

The generating and outputting of the reactive particles may include: supplying the gas, by the adjustable gas supply unit, and to a gas input of the reactive particles supply unit; outputting the reactive particles, by a first reactive particles output of the reactive particles supply unit and to a reactive particles input of an adjustable reactive particles output unit of the reactive particles supply unit; and passing the reactive particles through the reactive particles path and outputting the reactive particles from the adjustable reactive particles output unit.

Figure 13:
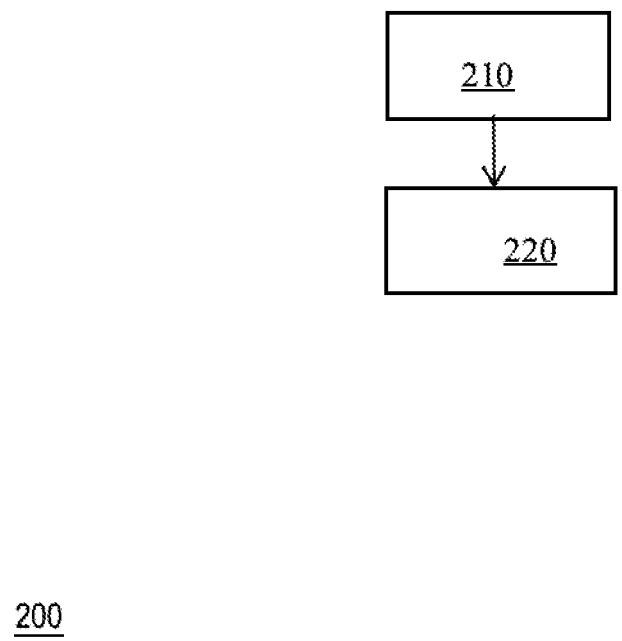
FIG. 13 illustrates an example of a method.

FIG. 13 illustrates method 200 for operating a reactive particles supply system.

Method 200 may start by step 210 of configuring the reactive particles supply system to provide reactive particles at a selected value of a reactive particles condition. The reactive particles condition may include at least one out of reactive particles pressure, reactive particles flow rate and reactive particles concentration.

Step 210 may include at least one out of:

Configuring an adjustable gas supply unit to supply gas and to set a gas condition to a value selected out of multiple values. The gas condition may include at least one out of gas pressure, gas flow rate and reactive particles concentration. The intermediate reactive particles condition corresponds to the gas condition—it is affected by the gas condition.

Mechanically configuring a reactive particles path of an adjustable reactive particles output unit, according to the reactive particles condition. The adjustable reactive particles output unit is located between a reactive particles supply unit and the vacuumed chamber.

Step 210 may be followed by step 220 of generating and outputting reactive particles of the selected value of the reactive particles condition by the reactive particles supply system. The outputted reactive particles may be used, for example, for cleaning a vacuum chamber that is fluidly coupled to the reactive particles supply. The outputted reactive particles may be used for any other purpose.

Step 220 may include at least one of the following:

Supplying gas by the adjustable gas supply unit and to the reactive particles supply unit.

Receiving the gas, by the reactive particles supply unit, and outputting reactive particles at the selected value of the reactive particles condition. The reactive particles supply unit may include a gas input and a first reactive particles output. The gas input is fluidly coupled to the adjustable gas supply unit and is arranged to receive the gas.

Outputting the reactive particles, by the adjustable reactive particles output unit, towards an opening of the vacuumed chamber. The adjustable reactive particles output unit may include a reactive particles input, a second reactive particles output, and a reactive particles path fluidly coupled between the reactive particles input and the second reactive particles output. The second reactive particles output is configured to output reactive particles towards the opening of the vacuumed chamber.

Step 220 may terminate and the cleaning may stop.

Alternatively—step 220 may be followed by step 210 to provide multiple iterations of steps 210 and 220. The selected reactive particles condition may be changed between one iteration to another.

In the foregoing specification, the embodiments of the disclosure has been described with reference to specific examples of embodiments of the disclosure. It will, however, be evident that various modifications and changes may be made therein without departing from the broader spirit and scope of the embodiments of the disclosure as set forth in the appended claims.

Moreover, the terms "front," "back," "top," "bottom," "over," "under", "away" "certain", "first", "second", and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to embodiments of the disclosure s containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the embodiments of the disclosure have been illustrated and described herein, many modifications, substitutions, changes, and equivalents will now occur to those of ordinary skill in the art. It is, therefore, to be understood that the appended claims are intended to cover all such modifications and changes as fall within the true spirit of the embodiments of the disclosure.

We claim:

1. A reactive particles supply system, the reactive particles supply system comprises:

an adjustable gas supply unit that is arranged to supply gas and to set a gas condition to a value selected out of multiple values; wherein the gas condition comprises at least one out of gas pressure, gas flow rate and gas reactive particles concentration;

a reactive particles supply unit comprising a gas input and a first reactive particles output, wherein the gas input is fluidly coupled to the adjustable gas supply unit and is arranged to receive the gas; wherein the first reactive particles output is arranged to output reactive particles at an intermediate reactive particles condition that corresponds to the gas condition; and wherein the intermediate reactive particles condition comprises at least one out of reactive particles pressure, reactive particles flow rate and reactive particles concentration; and an adjustable reactive particles output unit that comprises a reactive particles input, a second reactive particles output, and a reactive particles path fluidly coupled between the reactive particles input and the second reactive particles output, wherein the second reactive particles output is configured to output reactive particles at an output reactive particles condition and towards an opening of a vacuumed chamber; wherein the adjustable reactive particles output unit is arranged to mechanically configure at least one element of the reactive particles path according to the reactive particles condition, wherein the adjustable reactive particles output unit is arranged to configure the at least one element of the reactive particles path by a selection of a current aperture associated with the output reactive particles condition wherein the current aperture is selected out of different apertures associated with different values of the output reactive particles condition, and wherein the selection of the current aperture comprises replacing a previous aperture that was positioned within the reactive particles path by the current aperture by moving an aperture holder that holds the previous aperture and the current aperture.

2. The reactive particles supply system according to claim 1 wherein the adjustable reactive particles output unit is arranged to mechanically configure the at least one element of the reactive particles path by performing a mechanical operation within a sealed housing.

3. The reactive particles supply system according to claim 1 wherein the multiple values are associated with different cleaning modes of the vacuumed chamber.

4. The reactive particles supply system according to claim 3 wherein the different cleaning modes comprise (a) a first cleaning mode during which the reactive particles supply system is configured to output reactive particles at an output reactive particles condition of a first value, and (b) a second cleaning mode during which the reactive particles supply system is configured to output reactive particles at an output reactive particles condition of a second value, the second value is different than the first value.

5. The reactive particles supply system according to claim 4 wherein the reactive particles supply system, when operating in the first cleaning mode, is configured clean the vacuumed chamber while the vacuumed chamber is operated at a certain vacuum pressure; and wherein the reactive particles supply system, when operating in the second cleaning mode, is configured clean the vacuumed chamber while the vacuumed chamber is either deactivated or operated at another vacuum pressure that is higher than the certain vacuum pressure.

6. The reactive particles supply system according to claim 1 wherein the adjustable reactive particles output unit is arranged to configure the at least one element while the vacuumed chamber is active and without disassembling the reactive particles supply unit.

7. The reactive particles supply system according to claim 1 wherein the aperture holder belongs to a pivot arm.

8. The reactive particles supply system according to claim 1 further comprising an aperture holder manipulator that is configured to perform a rotational movement of the aperture holder, and a linear movement of the aperture holder.

9. The reactive particles supply system according to claim 1 wherein the selection of the current aperture comprises replacing the previous aperture that was positioned within the reactive particles path by the current aperture by moving the previous aperture and the current aperture within a sealed housing.

10. The reactive particles supply system according to claim 9 wherein the sealed housing comprises a first housing part and a second housing part; wherein the first housing part is located downstream to the reactive particles input; wherein the second housing part is located upstream to the vacuumed chamber.

11. The reactive particles supply system according to claim 8 wherein the aperture holder manipulator is configured to replace the previous aperture by (a) moving the aperture holder away from the first housing part, (b) rotate the aperture holder to position the current aperture within the reactive particles path, and (c) moving the aperture holder towards the first housing part.

12. The reactive particles supply system according to claim 10 wherein the reactive particles supply unit comprises a reactive particles supply unit output interface that has a first inner space, wherein the first reactive particles output extends within the first inner space, wherein the reactive particles supply system comprises a first adaptor that comprises an inner conduit, and one or more reactive particles sealing elements; wherein the first adaptor is shaped and sized to position the inner conduit within the reactive particles path when positioned, at least partially, within the first inner space; wherein the one or more reactive particles sealing elements are configured to prevent a leakage of reactive particles between the reactive particles supply unit output interface and the first adaptor.

13. The reactive particles supply system according to claim 12 wherein the first adaptor comprises a mechanical interface for holding an aperture sealing element, the aperture sealing element is configured to seal a connection between the first adaptor and the current aperture.

14. The reactive particles supply system according to claim 13 wherein the mechanical interface is configured to hold the aperture sealing element regardless of a distance between the aperture sealing element and the current aperture.

15. The reactive particles supply system according to claim 14 wherein the mechanical interface is a recess having a dovetail shaped cross section.

16. The reactive particles supply system according to claim 10 further comprising a first connector, and a second connector, wherein the sealed housing further comprises a sealing plate, a first connector opening, and a second connector opening; wherein the first connector is arranged to pass through the first connector opening and to connect the sealed housing to the vacuumed chamber.

17. The reactive particles supply system according to claim 16 wherein the sealing plate and an additional sealing element are configured to seal a connection between the first connector and the first connector opening; and wherein the second connector is configured to connect the sealing plate to the second housing part.

18. The reactive particles supply system according to claim 16 wherein an intermediate element is sealingly coupled to the vacuumed chamber and the second housing part when the sealed housing is connected to the vacuumed chamber by the first connector.

19. The reactive particles supply system according to claim 1 wherein a width of the adjustable reactive particles output unit does not exceed five centimeters.

20. A method for operating a reactive particles supply system, the method comprises:

configuring the reactive particles supply system to provide reactive particles at a selected value of an output reactive particles condition; wherein the output reactive particles condition comprises at least one out of reactive particles pressure, reactive particles flow rate and reactive particles concentration;

and generating and outputting reactive particles of the selected value of the output reactive particles condition by the reactive particles supply system;

wherein the configuring of the reactive particles supply system comprises:

setting an adjustable gas supply unit of the reactive particles supply system to supply gas of a gas condition to a value selected out of multiple values; wherein the gas condition comprises at least one out of gas pressure, gas flow rate and gas reactive particles concentration; and mechanically configuring, by an adjustable reactive particles output unit of the reactive particles supply system, at least one element of a reactive particles path according to the output reactive particles condition of the selected value by selecting a current aperture associated with the output reactive particles condition of the selected value, wherein the current aperture is selected out of different apertures associated with different values of the output reactive particles condition, and selecting the current aperture comprises replacing a previous aperture positioned within the reactive particles path by the current aperture by moving an aperture holder that holds the previous aperture and the current aperture;

wherein the generating and outputting of the reactive particles comprises:
supplying the gas, by the adjustable gas supply unit, and to a gas input of the reactive particles supply system;
outputting the reactive particles, by a first reactive particles output of the reactive particles supply system and to a reactive particles input of the adjustable reactive particles output unit of the reactive particles supply system; and
passing the reactive particles through the reactive particles path and outputting the reactive particles from the adjustable reactive particles output unit.

* * * * *